(12) United States Patent
Wang

(10) Patent No.: US 12,451,459 B2
(45) Date of Patent: Oct. 21, 2025

(54) WIRE BONDING APPARATUS, WIRE BONDING METHOD AND SEMICONDUCTOR DEVICE

(71) Applicant: YANGTZE MEMORY TECHNOLOGIES CO., LTD., Wuhan (CN)

(72) Inventor: Xuhui Wang, Wuhan (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 161 days.

(21) Appl. No.: 18/456,297

(22) Filed: Aug. 25, 2023

(65) Prior Publication Data

US 2024/0395765 A1   Nov. 28, 2024

(30) Foreign Application Priority Data

May 26, 2023   (CN) .......................... 202310610100.5

(51) Int. Cl.
*B23K 20/00*   (2006.01)
*H01L 23/00*   (2006.01)

(52) U.S. Cl.
CPC ............ *H01L 24/78* (2013.01); *B23K 20/004* (2013.01); *B23K 20/005* (2013.01);
(Continued)

(58) Field of Classification Search
CPC ......... H01L 24/78; H01L 24/48; H01L 24/85; H01L 2224/48453; H01L 2224/78253; H01L 2224/7855; H01L 2224/78841; H01L 2224/85035; H01L 2224/85181; H01L 2924/35; H01L 24/45; H01L 2224/78; H01L 2224/85201; H01L 2224/85801; B23K 3/00; B23K 3/04; B23K 3/08;
(Continued)

(56) References Cited

U.S. PATENT DOCUMENTS 5,238,173 A * 8/1993 Ura .................... H01L 24/78
                                                  228/104
6,260,753 B1 * 7/2001 Renard ................ H01L 24/13
                                                  228/180.5
(Continued)

FOREIGN PATENT DOCUMENTS

CN    104282591 B  * 11/2017  ............ H01L 24/78
CN    111613543 A  *  9/2020  ............ H01L 24/85
(Continued)

*Primary Examiner* — Kiley S Stoner
(74) *Attorney, Agent, or Firm* — Conley Rose, P.C.

(57) ABSTRACT

The present disclosure provides a wire bonding apparatus, a wire bonding method and a semiconductor device. The wire bonding apparatus includes: a wire tube for containing the wire and including a wire exit; a wire heating assembly located at a side of the wire exit; and a pre-shaping assembly located at a side of the wire tube and including a wire pre-pressing face; the pre-shaping assembly having a first state in which the wire pre-pressing face of the pre-shaping assembly is configured to abut the wire tube and a second state in which the pre-shaping assembly is configured to disengage from the wire tube. The wire bonding apparatus, the wire bonding method and the semiconductor device as provided in the present disclosure can reduce or eliminate the cratering effect.

20 Claims, 7 Drawing Sheets

(52) U.S. Cl.
CPC ............ *B23K 20/007* (2013.01); *H01L 24/48* (2013.01); *H01L 24/85* (2013.01); *H01L 2224/48453* (2013.01); *H01L 2224/78253* (2013.01); *H01L 2224/7855* (2013.01); *H01L 2224/78841* (2013.01); *H01L 2224/85035* (2013.01); *H01L 2224/85181* (2013.01); *H01L 2924/35* (2013.01)

(58) Field of Classification Search
CPC .. B23K 3/087; B23K 2101/40; B23K 20/004; B23K 20/005; B23K 20/007
USPC ................................................ 228/180.5, 4.5
See application file for complete search history.

(56) References Cited

U.S. PATENT DOCUMENTS

| | | | |
|---|---|---|---|
| 2004/0000578 A1* | 1/2004 | Nishiura | B23K 20/007 228/180.5 |
| 2008/0293235 A1* | 11/2008 | Deju | H01L 24/48 257/E21.476 |
| 2024/0347500 A1* | 10/2024 | Song | H01L 24/78 |

FOREIGN PATENT DOCUMENTS

| | | | | | |
|---|---|---|---|---|---|
| CN | 113782454 | A | * | 12/2021 | |
| CN | 116325101 | A | * | 6/2023 | ........... B23K 20/004 |
| JP | H06252197 | A | * | 9/1994 | |
| JP | H06252199 | A | * | 9/1994 | |
| JP | H06349878 | A | * | 12/1994 | |
| JP | H0799202 | A | * | 4/1995 | |
| JP | H0945721 | A | * | 2/1997 | |
| JP | H1098065 | A | * | 4/1998 | |
| JP | H09223708 | A | * | 4/1998 | |
| JP | H1126496 | A | * | 1/1999 | |
| JP | H11312707 | A | * | 11/1999 | |
| JP | 2003133356 | A | * | 5/2003 | .............. H01L 24/11 |
| JP | 2003142516 | A | * | 5/2003 | .............. H01L 24/78 |
| JP | 2003152013 | A | * | 5/2003 | .............. H01L 24/78 |
| JP | 2005045135 | A | * | 2/2005 | .............. H01L 24/48 |
| JP | 2008172010 | A | * | 7/2008 | .............. H01L 24/43 |
| JP | 2011086858 | A | * | 4/2011 | .............. H01L 24/78 |
| TW | 201430978 | A | * | 8/2014 | .............. H01L 24/78 |
| WO | WO-2007010510 | A2 | * | 1/2007 | ........... B08B 7/0035 |

* cited by examiner

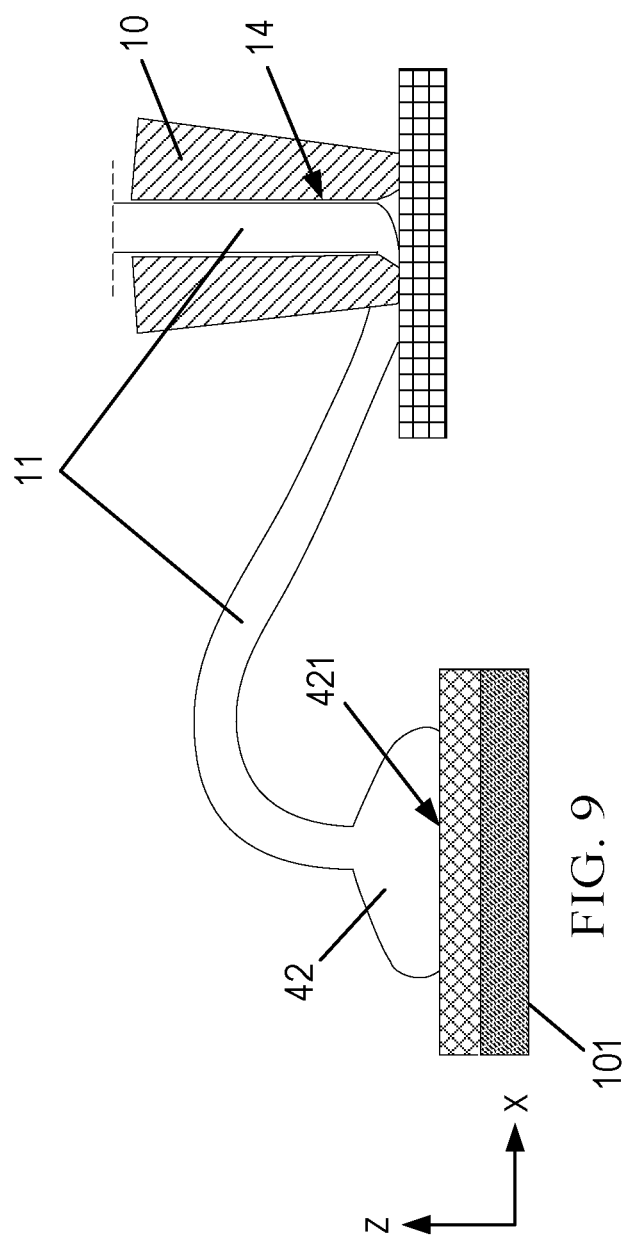

WIRE BONDING APPARATUS, WIRE BONDING METHOD AND SEMICONDUCTOR DEVICE

CROSS-REFERENCE TO RELATED APPLICATIONS

The present application claims priority to Chinese Patent Application No. 2023106101005, which was filed May 26, 2023, is titled "WIRE BONDING DEVICE, WIRE BONDING METHOD AND SEMICONDUCTOR DEVICE," and is hereby incorporated herein by reference in its entirety.

TECHNICAL FIELD

The present disclosure relates to the field of wire bonding technology, particularly to a wire bonding apparatus, a wire bonding method and a semiconductor device.

BACKGROUND

While bonding a wire onto a chip, the aluminum pad of the chip may be extruded by the solder ball significantly, subjecting the chip pad to a cratering effect.

SUMMARY

In view of this, the present disclosure provides a wire bonding apparatus, a wire bonding method and a semiconductor device which can reduce or eliminate the cratering phenomenon.

In order to address the above-described problem, the present disclosure provides a technical solution as follows.

The present disclosure provides a wire bonding apparatus, comprising:
  a wire tube configured to contain a wire and comprising a wire exit;
  a wire heating assembly located at a side of the wire exit; and
  a pre-shaping assembly located at a side of wire tube and comprising a wire pre-pressing face;
  wherein the pre-shaping assembly has a first state and a second state, the wire pre-pressing face of the pre-shaping assembly in the first state is configured to abut the wire tube, and the pre-shaping assembly in the second state is configured to disengage from the wire tube.

In some implementations, the wire bonding apparatus further comprises:
  a carrier platform comprising a carrier face on which a bonding element is located;
  wherein an orthogonal projection of the wire tube on the carrier face lies on the carrier face;
  the pre-shaping assembly in the first state is located between the carrier face and the wire tube; and
  an overlap degree between an orthogonal projection of the pre-shaping assembly in the second state on the carrier face and an orthogonal projection of the wire tube on the carrier face is 0.

In some implementations, the wire tube extends in a first direction, and the wire bonding apparatus further comprises a first driver connected with the wire tube;
  wherein the first driver can drive the wire tube to reciprocate in the first direction.

In some implementations, the wire bonding apparatus further comprises a second driver connected with the pre-shaping assembly;
  wherein the second driver can drive the pre-shaping assembly to switch between the first state and the second state.

In some implementations, the second driver can drive the pre-shaping assembly to move in a second direction intersecting the first direction.

In some implementations, the wire bonding apparatus further comprises a holder comprising a guiding groove extending in the first direction, and the wire tube passes through the guiding groove and is fixed therein.

In some implementations, the wire pre-pressing face is a camber surface, a circle to which the camber surface of the wire pre-pressing face belongs has a radius greater than a radius of a circle to which a camber surface of a solder ball formed by heating the wire protruding out of the wire tube belongs, wherein the camber surface of the solder ball faces the carrier face.

In some implementations, the wire bonding apparatus further comprises a wire pulling assembly, the wire tube is located between the wire pulling assembly and the carrier platform.

In some implementations, the wire bonding apparatus further comprises a wire tensioning assembly; the wire pulling assembly being located between the wire tensioning assembly and the wire tube.

In some implementations, the pre-shaping assembly in the first state is located on carrier face.

In some implementations, at least a part of the wire pre-pressing face is a plane.

The present disclosure further provides a wire bonding method, comprising:
  starting a wire heating assembly to convert a wire protruding from a wire exit of a wire tube into an initial solder ball;
  driving a pre-shaping assembly to move relative to the wire exit such that a wire pre-pressing face of the pre-shaping assembly contacts the initial solder ball;
  driving the wire tube to move in a first direction relative to the pre-shaping assembly so as to generate a pre-pressure between the initial solder ball and the wire pre-pressing face of the pre-shaping assembly to convert the initial solder ball into a solder ball, wherein a height of the initial solder ball in the first direction is greater than a height of the solder ball in the first direction;
  driving the pre-shaping assembly to move away from the wire tube; and
  placing a first bonding element on a bonding site, driving the wire tube to move in the first direction relative to the first bonding element, and bonding the solder ball on the first bonding element.

In some implementations, the first bonding element comprises a circuit layer and a pad, and the pad is located on and connected with the circuit layer; and
  bonding the solder ball on the first bonding element comprises:
  bonding the solder ball on the pad.

In some implementations, the method further comprises, after bonding the solder ball on the first bonding element:
  driving the wire tube such that the wire tube disengages from the solder ball;
  moving the first bonding element to be away from the bonding site, and pulling wire out of the wire tube during a process of moving the first bonding element;
  placing a second bonding element on the bonding site; and driving the wire tube to move towards the second bonding element and bonding the wire on the second bonding element.

The method further comprises, before driving the pre-shaping assembly to be away from the wire tube:

driving the wire tube to disengage from the pre-shaping assembly.

The present disclosure further provides a wire bonding method, comprising:

heating an end of a wire to convert the end of the wire into an initial solder ball;

Pre-pressing the initial solder ball in a first direction to obtain a solder ball, wherein a height of the initial solder ball in the first direction is greater a height of the solder ball in the first direction; and bonding the solder ball on the first bonding element.

The present disclosure also provides a semiconductor device, comprising:

a first bonding element comprising a pad;

a second bonding element; and a wire connecting the first bonding element and the second bonding element, the wire having a solder ball at an end, the wire connected with a pad of the first bonding element via the solder ball;

wherein the solder ball comprises a bonding face bonded with the pad, and the pad has a consistent height in a bonding direction.

In some implementations, the first bonding element further comprises a circuit layer located at a side of the pad away from the solder ball, and the pad and the circuit layer are stacked in the bonding direction.

In some implementations, the second bonding element is bonded with an end of the wire away from the solder ball.

With the wire bonding apparatus, the wire bonding method and the semiconductor device as provided in the present disclosure, it is possible to reduce or eliminate the cratering effect by adding a pre-shaping assembly with a wire pre-pressing face on a side of a wire tube, pre-pressing on the wire pre-pressing face of the pre-shaping assembly before bonding the initial solder ball at one end of the wire and the first bonding element to obtain a solder ball such that the initial solder ball has a height in the first direction greater than the height of the solder ball in the first direction, and the surface of the solder ball facing the bonding element has an increased flatness, the contact area between the solder ball and the pad increases upon subsequent bonding on the bonding element (pad), not too large force is needed while bonding the solder ball and the pad, which in turn leads to a uniform distribution of the pad under the solder ball.

BRIEF DESCRIPTION OF THE DRAWINGS

FIG. 9 is a diagram of bonding the wire and the second bonding element, in accordance with various implementations.

DETAILED DESCRIPTION

Technical solutions in some implementations will be described hereafter with reference to accompanying drawings in some implementations. The implementations to be described are only some, not all, implementations of the present disclosure.

It should be understood that terms such as "on", "under" and the like in the description of the present disclosure refer to the azimuth or position relationship based on what is shown in figures, which are only for the purpose of facilitating describing the present disclosure and simplifying description rather than indicating or implying that the mentioned devices or elements must have certain azimuth, or must be constructed and operated in certain azimuth, and therefore are not constructed as limiting the present disclosure. Furthermore, terms such as "first", "second" and the like are only used for description rather than being interpreted as indicating or implying relative importance or implicitly indicating the number of the referenced technical features. Therefore, a feature qualified by "first" or "second" may include explicitly or implicitly one or more instances of the feature. In the description of the present disclosure, "a plurality of" means two or more unless otherwise specified.

In the description of the present disclosure, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. A layer can extend horizontally, vertically, and/or along a tapered surface. A layer can include multiple sub-layers. For example, an interconnect layer can include one or more conductor and contact sub-layers (in which interconnect lines and/or via contacts are formed) and one or more dielectric sub-layers.

In view of the technical problem of cratering effects in existing bonding methods, it is possible to reduce or eliminate the cratering effect by adding a pre-shaping assembly with a wire pre-pressing face on a side of the wire tube, pre-pressing on the wire pre-pressing face of the pre-shaping assembly before bonding the initial solder ball at one end of the wire and the first bonding element to obtain a solder ball such that the initial solder ball has a height in the first direction greater than the height of the solder ball in the first direction, and the surface of the solder ball facing the bonding element has an increased flatness, the contact area between the solder ball and the pad increases upon subsequent bonding on the bonding element (pad), a large force is not needed while bonding the solder ball and the pad, which in turn leads to a uniform distribution of aluminum in the pad under the solder ball.

Figure 1:
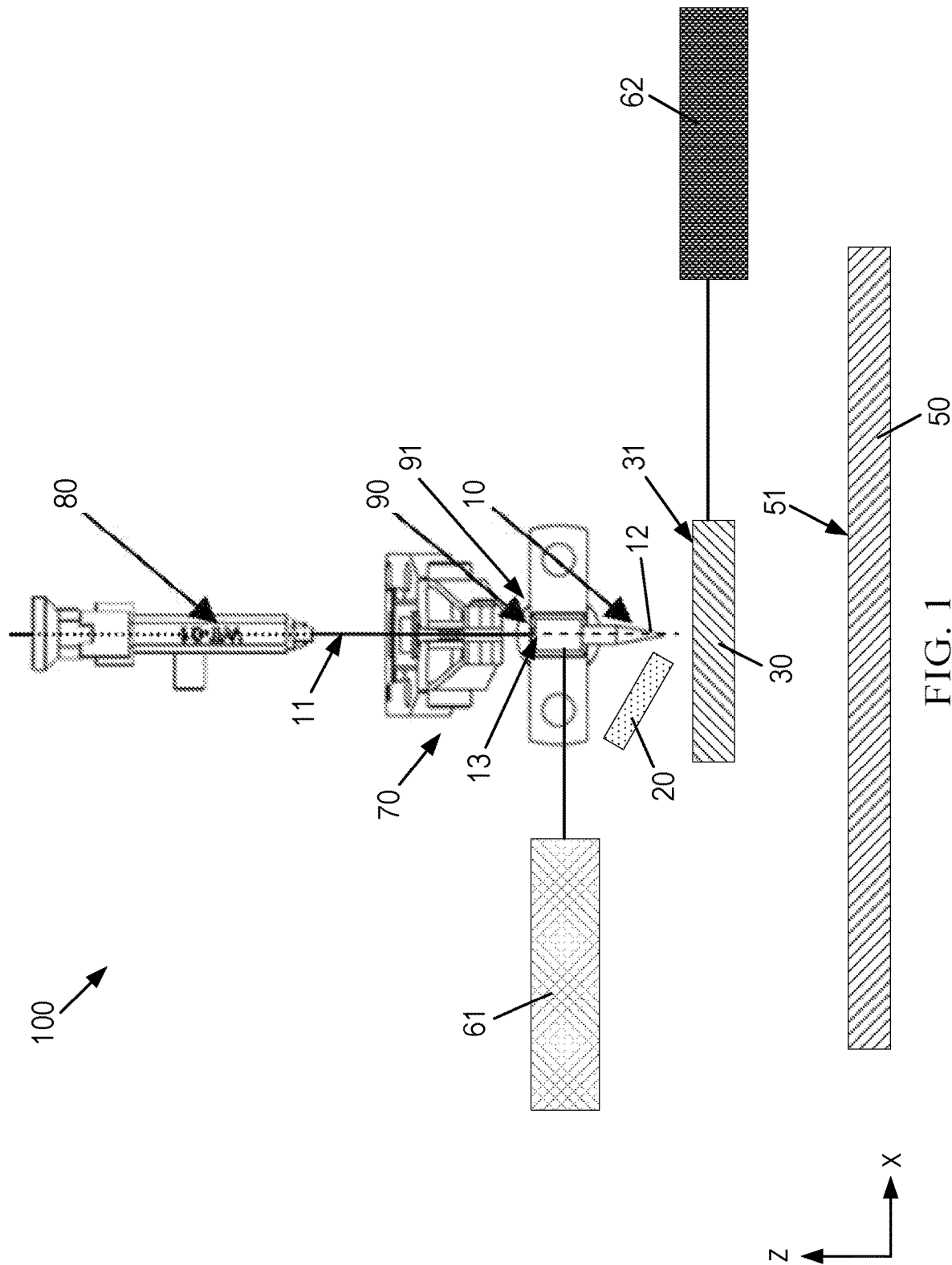
FIG. 1 is a diagram of a wire bonding apparatus provided in the present disclosure, in accordance with various implementations.

Referring to FIG. 1, some implementations of the present disclosure provide a wire bonding apparatus 100 including a wire tube 10 for containing the wire 11 and including a wire exit 12, a wire heating assembly 20 located on a side of the wire exit 12 and a pre-shaping assembly 30 located on a side of the wire tube 10 and including a wire pre-pressing face 31. The pre-shaping assembly 30 has a first state in which the wire pre-pressing face 31 of the pre-shaping assembly 30 abuts the wire tube 10 and a second state in which the pre-shaping assembly 30 disengages from the wire tube 10. In particular, a pre-pressure is generated between the wire pre-pressing face 31 of the pre-shaping assembly 30 in the first state and the wire tube 10.

Figure 4:
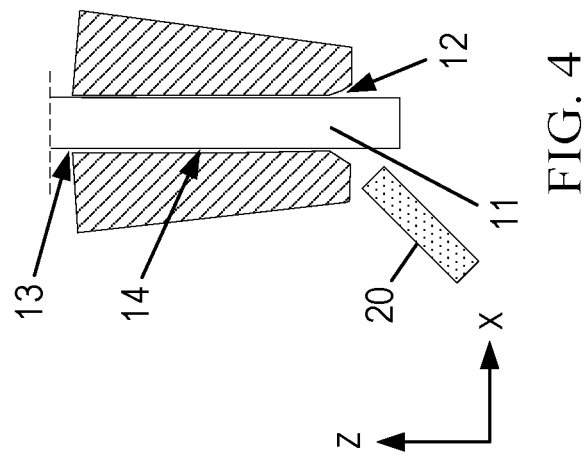
FIG. 4 is a diagram of a wire, a wire tube and a wire heating assembly provided in the present disclosure, in accordance with various implementations.

As shown in FIG. 4, the wire tube 10 extends in the first direction Z and further includes a wire entry 13 located at an end of the wire tube 10 away from the wire exit 12. The wire tube 10 further has a wire cavity 14 extending in the first direction Z. The wire entry 13 and the wire exit 12 are located at two ends of the wire cavity 14 in the first direction Z, respectively, and are in communication with the wire cavity 14, respectively. The wire 11 is inserted into the wire cavity 14 via the wire entry 13 and leaves the wire tube 10 via the wire exit 12.

The wire 11 is a bare or coating-less metal wire that may be a bare copper wire, copper alloy, silver, silver alloy, aluminum, aluminum alloy, etc.

In some implementations, the wire 11 is a bare or coating-less copper wire.

Figure 5:
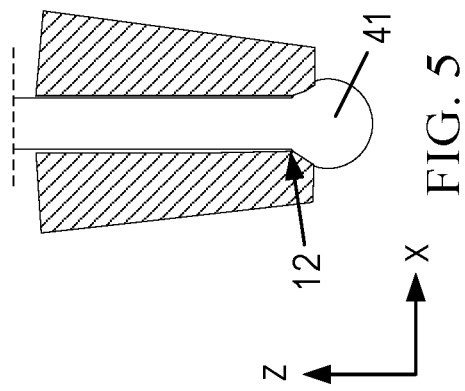
FIG. 5 is a diagram of the wire shown in FIG. 4 that is formed with a solder ball at one end, in accordance with various implementations.

The wire heating assembly 20 is configured to heat the wire 11 protruding from the wire exit 12 such that the wire 11 protruding from the wire exit 12 forms an initial solder ball 41, as shown in FIG. 5. In particular, the wire heating assembly 20 may generate hydrogen flame or electric spark. In this implementation, the wire heating assembly 20 is an electronic flame-off (EFO) device.

Figure 6:
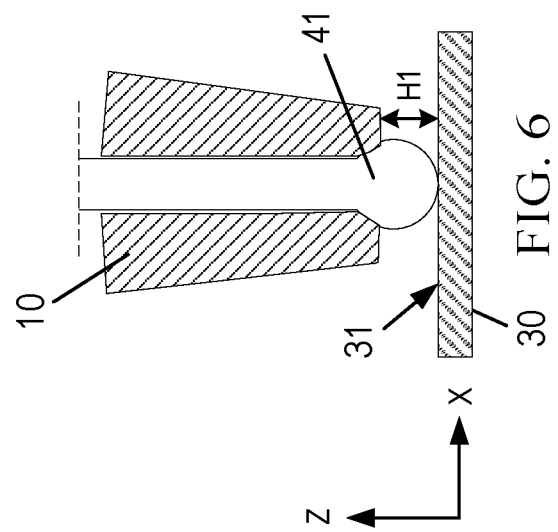
FIG. 6 is a diagram of the relative position relationship between the solder ball shown in FIG. 5 and the pre-shaping assembly, in accordance with various implementations.
Figure 7:
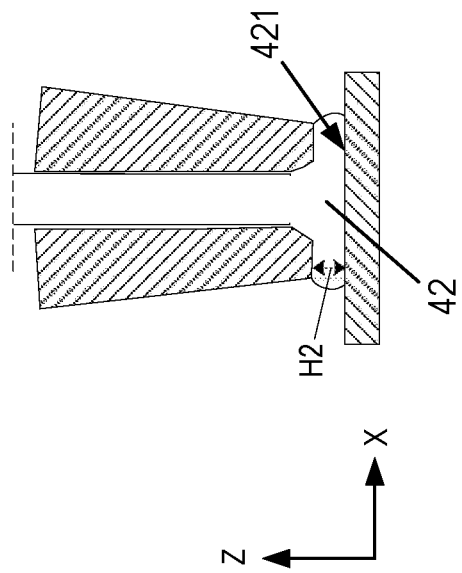
FIG. 7 is a diagram of the solder ball shown in FIG. 6 after being shaped on the pre-shaping assembly, in accordance with various implementations.

The pre-shaping assembly 30 is configured to convert the initial solder ball 41 into the solder ball 42, as FIGS. 6 and 7 show.

In some implementations, the material for the pre-shaping assembly 30 may be ceramics. In the present disclosure, the material for the pre-shaping assembly 30 is not limited to ceramics and may also be other hard materials, such as metals, etc.

In some implementations, at least a part of the wire pre-pressing face 31 is planar. In this implementation, the wire pre-pressing face 31 is a plane. Of course, the plane herein does not refer to a surface without sharp bumps. The flatter the wire pre-pressing face 31 is, the better.

In some implementations, the wire pre-pressing face 31 is a camber surface. The circle to which the camber surface belongs has a radius greater than the radius of the circle to which the camber surface of the initial solder ball 41 protruding out from the wire tube 10 belongs.

In particular, the wire tube 10 applies a force to the pre-shaping assembly 30 such that the initial solder ball 41 can be pre-pressed on the wire pre-pressing face 31 of the pre-shaping assembly 30 to obtain the solder ball 42. A part of the initial solder ball 41 that protrudes from the wire tube 10 has a height in the first direction Z greater than the height in the first direction Z of a part of the solder ball 42 that protrudes from the wire tube 10.

In some implementations, the wire bonding apparatus 100 further includes a carrier platform 50 including a carrier face 51 for carrying bonding elements. The orthogonal projection of the wire tube 10 on the carrier face 51 lies on the carrier face 51, that is, the wire tube 10 and the carrier platform 50 are disposed in the first direction Z and the wire tube 10 is located opposite the carrier face 51 of the carrier platform 50. The pre-shaping assembly 30 in the first state is located between the carrier face 51 and the wire tube 10, and the overlap degree between the orthogonal projection of the pre-shaping assembly 30 in the second state on the carrier face 51 and the orthogonal projection of the wire tube 10 on the carrier face 51 is 0. That is, the orthogonal projection of the pre-shaping assembly 30 in the second state falls outside of the orthogonal projection of the wire tube 10 on the carrier face 51. That is, the pre-shaping assembly 30 in the second state is away from the wire tube 10 in the second direction X. The second direction X intersects the first direction Z. In this implementation, the second direction X is perpendicular to the first direction Z.

In some implementations, the wire bonding apparatus 100 further includes a first driver 61 connected with the wire tube 10. The first driver 61 can drive the wire tube 10 to reciprocate in the first direction Z. In particular, the first driver 61 may be an element such as a driving motor or a robotic arm that can drive the wire tube 10 to reciprocate in the first direction Z.

In some implementations, the wire bonding apparatus 100 further includes a second driver 62 connected with the pre-shaping assembly 30. The second driver 62 can drive the pre-shaping assembly 30 to switch between the first state and the second state. In particular, the second driver 62 can drive the pre-shaping assembly 30 to reciprocate in the second direction X such that the pre-shaping assembly 30 can switch between the first state and the second state.

In some implementations, the wire bonding apparatus 100 further includes a wire pulling assembly 70. The wire tube 10 is located between the wire pulling assembly 70 and the carrier platform 50. The wire pulling assembly 70 is configured to pull the wire 11 to cause the wire 11 to move in the wire tube 10.

In some implementations, the wire bonding apparatus 100 further includes a wire tensioning assembly 80 and the wire pulling assembly 70 may be located between the wire tensioning assembly 80 and the wire tube 10, or at a side of the wire tensioning assembly 80 away from the wire tube 10. In the present implementations, the wire pulling assembly 70 may be located between the wire tensioning assembly 80 and the wire tube 10.

The wire tensioning assembly 80 is configured to tension the wire 11 to facilitate the wire pulling assembly 70 pulling the wire 11 to move in the wire tube 10 and cooperate with the wire pulling assembly 70 to guarantee the length of the wire that protrudes out of the wire exit 12.

In some implementations, the wire bonding apparatus 100 further includes a holder 90 including a guiding groove 91 extending in the first direction Z, and the wire tube 10 passes through the guiding groove 91 and is fixed therein. The holder 90 is configured to hold and fix the wire tube 10 to guarantee the stability and position of the wire tube 10.

In some implementations, the wire bonding apparatus 100 further includes an ultrasonic wave generating device for applying ultrasonic vibration to the solder ball 42 to bond the solder ball 42 on the bonding element.

The wire bonding apparatus 100 may further include a wire cleaning device or a polisher for selectively removing contaminants such as copper oxides on the wire 11 before entering the wire tube 10. The wire cleaning device or the wire polisher may be located at any location in front of the wire tube 10, e.g., between the wire tube 10 and the wire pulling assembly 70, between the wire pulling assembly 70 and the wire tensioning assembly 80, or between the wire tube 10 and the wire tensioning assembly 80. The wire cleaning device or the wire polisher may also not be included in the wire bonding apparatus 100.

In some implementations, the wire polisher may be a mechanical polisher.

In other implementations of the present disclosure, other elements may be added to the wire bonding apparatus as desired for better bonding.

With the wire bonding apparatus 100, by adding a pre-shaping assembly 30 having a wire pre-pressing face 31 on one side of the wire tube 10, it is possible to allow the initial solder ball 41 to be pre-pressed on the wire pre-pressing face 31 of the pre-shaping assembly 30 after one end of the wire 11 is heated by the wire heating assembly 20 and the initial solder ball 41 is obtained to produce the solder ball 42. The height of the part of the initial solder ball 41 that protrudes from the wire tube 10 in the first direction Z is greater than the height in the first direction Z of a part of the solder ball 42 that protrudes from the wire tube 10. The surface of the solder ball 42 that faces the bonding element has an increased flatness such that the contact area between the solder ball 42 and the pad is increased upon subsequent bonding on the first bonding element (pad), so a large force is not needed while bonding the solder ball 42 and the pad. Therefore, the aluminum in the pad under the solder ball is uniformly distributed, thereby reducing or eliminating the cratering effect.

Figure 8:
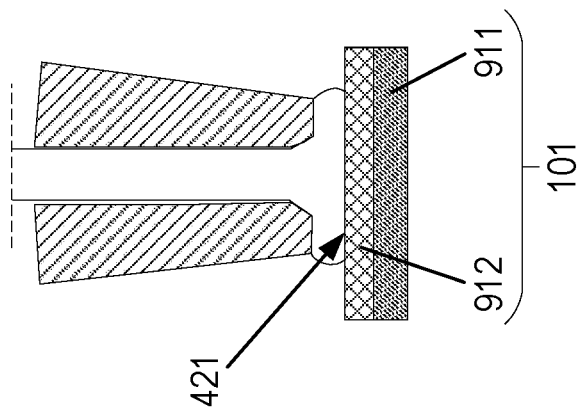
FIG. 8 is a diagram of bonding the shaped solder ball and the first bonding element, in accordance with various implementations.

Referring to FIGS. 2 and 4 to 10, some implementations of the present disclosure provide a wire bonding method including:

operation S1: referring to FIGS. 4 to 5, starting the wire heating assembly 20 to convert the wire 11 protruding from the wire exit 12 of the wire tube 10 into an initial solder ball 41;

operation S2: referring to FIG. 6, driving the pre-shaping assembly 30 to move relative to the wire exit 12 such that the wire pre-pressing face 31 of the pre-shaping assembly 30 contacts the initial solder ball 41;

operation S3: referring to FIG. 7, driving the wire tube 10 to move in the first direction Z relative to the pre-shaping assembly 30 so as to generate a pre-pressure between the initial solder ball 41 and the wire pre-pressing face 31 of the pre-shaping assembly 30 to convert the initial solder ball 41 into the solder ball 42, the height H1 of the part of the initial solder ball 41 that protrudes from the wire tube 10 in the first direction Z is greater than the height H2 in the first direction Z of a part of the solder ball 42 that protrudes from the wire tube 10;

operation S4: referring to FIGS. 7 and 8, driving the pre-shaping assembly 30 such that the pre-shaping assembly 30 moves away from the wire tube 10; and operation S5: referring to FIG. 8, placing the first bonding element 101 on the bonding site, driving the wire tube 10 to move in the first direction Z relative to the first bonding element 101 and bonding the solder ball 42 on the first bonding element 101.

Before operation S1, the method further includes containing the wire 11 in the wire tube 10 and forcing partial wire 11 to protrude out of the wire exit 12 of the wire tube 10, and clamping the wire pulling assembly 70 and the wire tensioning assembly 80 on the wire 11, respectively, to pull and tension the wire 11.

In operation S2, the pre-shaping assembly 30 is driven to move to a position between the wire exit 12 and the carrier face 51 in the second direction X. In particular, in this implementation, the pre-shaping assembly 30 may be located on the carrier face 51. In other implementations of the present disclosure, the pre-shaping assembly 30 may also not be located on the carrier face 51, but the pre-shaping assembly 30 is suspended over the carrier face 51 by a robotic arm, a driver, etc.

In operation S3, the shape of the surface of solder ball 42 away from the wire tube 10 is consistent with the shape of the wire pre-pressing face 31.

In operation S3, the initial solder ball 41 and the solder ball 42 are not necessarily outside the wire tube 10. It is possible parts of the initial solder ball 41 and the solder ball 42 are located inside the wire tube 10. Therefore, the height H1 of the initial solder ball 41 in the first direction Z and the height H2 of the solder ball 42 in the first direction Z both refer to the partial solder balls that protrude outside of the wire tube 10. In particular, the height H1 of the part of the initial solder ball 41 that protrudes out of the wire tube 10 in the first direction Z may also be considered as the farthest vertical distance in the first direction Z from the end of the wire tube 10 which has the solder ball to the initial solder ball 41, and the height H2 of the part of the solder ball 42 that protrudes out of the wire tube 10 in the first direction Z may also be considered as the distance in the first direction Z from the end of the wire tube 10 which has the solder ball to the wire pre-pressing face 31 of the pre-shaping assembly 30.

In operation S3, the solder ball 42 includes a bonding face 421 away from the wire 11, which contacts the surface of a pad 912 away from a circuit layer 911. The pad 912 has a consistent height in the first direction Z.

In operation S4, the pre-shaping assembly 30 is driven to move away from the wire tube 10 in the second direction X such that the overlap degree between the orthogonal projection of the pre-shaping assembly 30 in the second state on the carrier face 51 and the orthogonal projection of the wire tube 10 on the carrier face 51 is 0.

Before operation S4, the method further includes driving the wire tube 10 such that the wire tube 10 disengages from the pre-shaping assembly 30.

In particular, the first bonding element 101 includes the circuit layer 911 and the pad 912 located on and connected with the circuit layer 911; and operation S5 includes: bonding the solder ball 42 on the pad 912.

The circuit layer 911 includes one or more combinations of a logic circuit, a driving circuit, an amplification circuit, and/or a digital-to-analog converting circuit. The circuit layer 911 may include semiconductor devices such as a complementary metal oxide semiconductor (CMOS), a dynamic random access memory (DRAM), a laterally diffused metal oxide semiconductor (LDMOS), an insulated gate bipolar transistor (IGBT), and a flash memory.

The pad 912 and the circuit layer 911 are connected and exposed from the first bonding element 101 to facilitate bonding of the solder ball 42.

Figure 2:
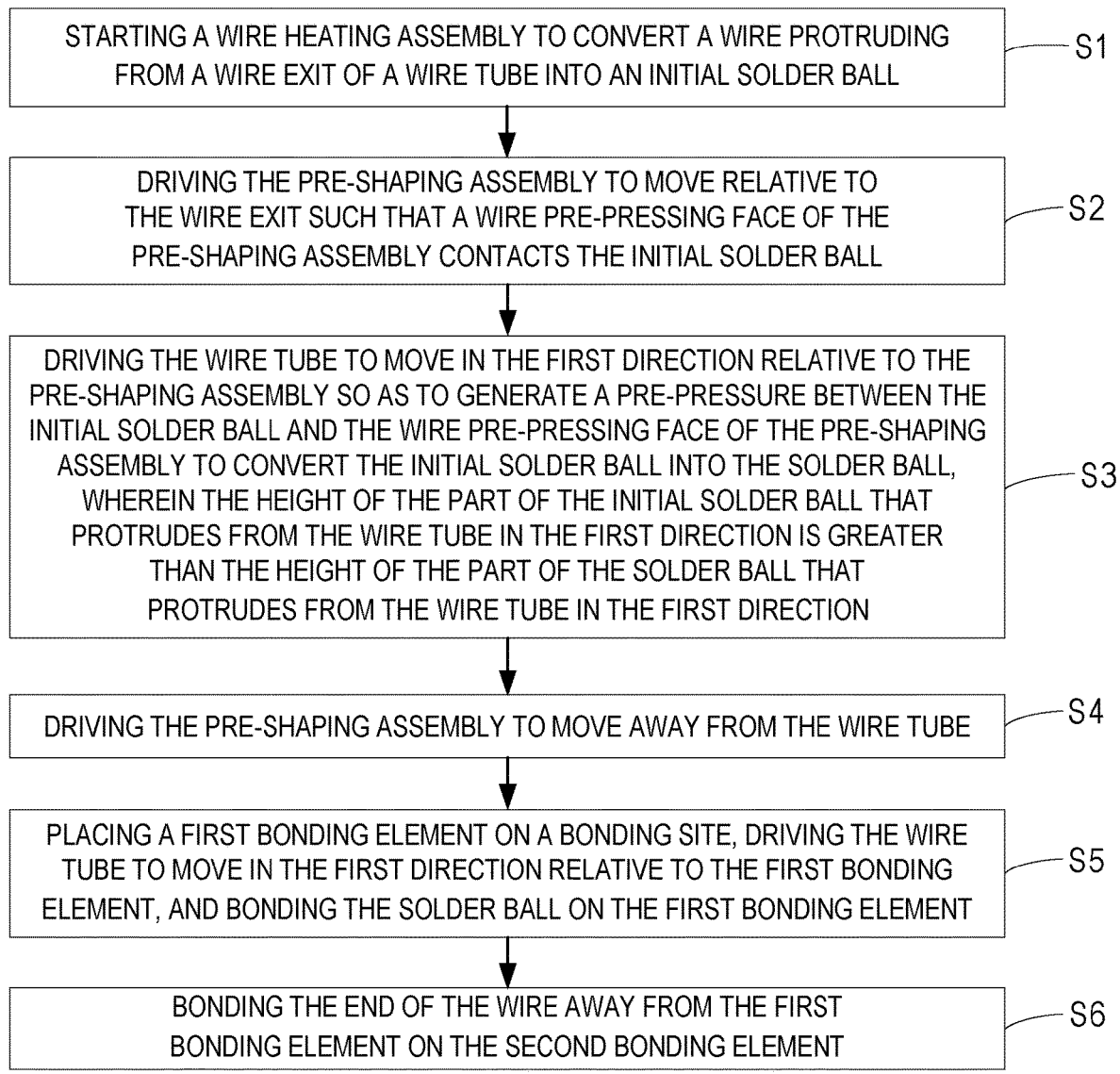
FIG. 2 is a flow chart of a wire bonding method provided in the present disclosure, in accordance with various implementations.
Figure 3:
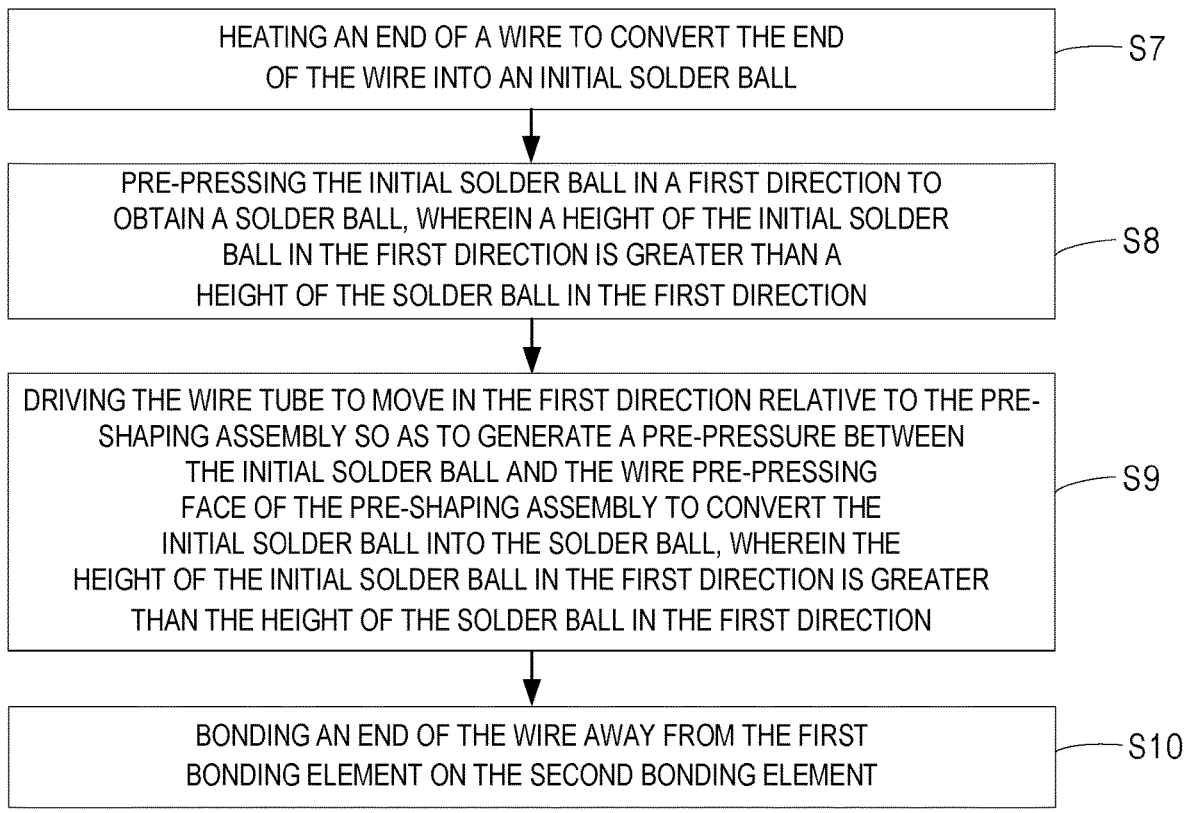
FIG. 3 is a flow chart of another wire bonding method provided in the present disclosure, in accordance with various implementations.
Figure 10:
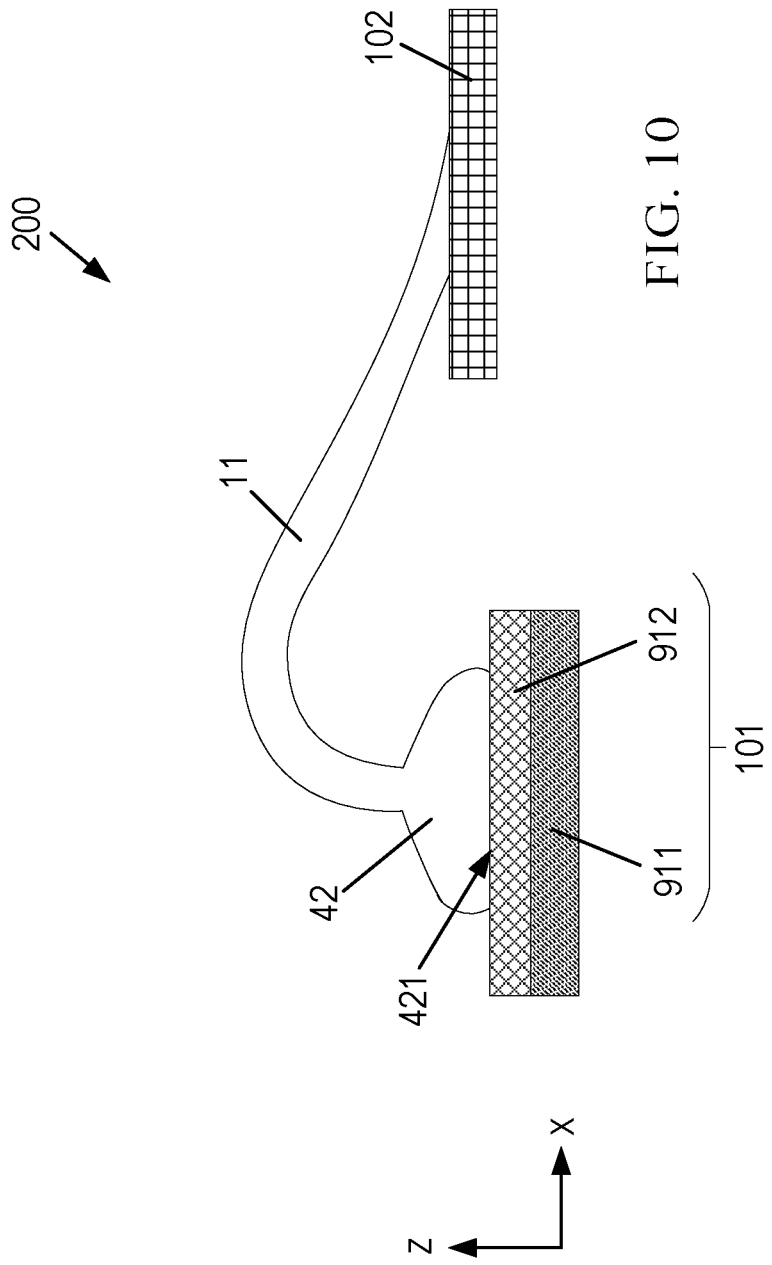
FIG. 10 is a diagram of a semiconductor device formed by bonding the wire and the first and second bonding elements, in accordance with various implementations.

Referring to FIGS. 2, 9, and 10, after operation S5, the method further includes operation S6: bonding the end of the wire 11 away from the first bonding element 101 on the second bonding element 102. In particular, firstly, the wire tube 10 is driven such that the wire tube 10 disengages from the solder ball 42; secondly, the first bonding element 101 is moved such that the first bonding element 101 moves away from the bonding site, and partial wire 11 is pulled out from the wire tube 10 in the process of moving the first bonding element 101; and thirdly, referring to FIGS. 9 to 10, the second bonding element 102 is placed at the bonding site, and the wire tube 10 is driven towards the second bonding element 102 and the wire 11 is bonded on the second bonding element 102.

The structure of the second bonding element 102 may be the same as or different from the structure of the first bonding element 101 depending on practical conditions.

Referring to FIGS. 3 to 10, the present disclosure further provides a wire bonding method including:

- operation S7: heating an end of the wire 11 to convert an end of the wire 11 into an initial solder ball 41;
- operation S8: pre-pressing the initial solder ball 41 in the first direction Z to obtain a solder ball 42, the height of the initial solder ball 41 in the first direction Z is greater than the height of the solder ball 42 in the first direction Z; and
- operation S9: bonding the solder ball 42 on the first bonding element 101.

After operation S9, the wire bonding method further includes operation S10: bonding an end of the wire 11 away from the first bonding element 101 on the second bonding element 102.

The present disclosure further provides a semiconductor device 200 manufactured by the above-described wire bonding method. In particular, the semiconductor device 200 includes a first bonding element 101, a second bonding element 102 and a wire 11 connecting the first bonding element 101 and the second bonding element 102, the wire 11 having a solder ball 42 at one end, the wire 11 being bonded with the first bonding element 101 via the solder ball 42, and the other end of the wire 11 being bonded with the second bonding element 102.

The first bonding element 101 includes the circuit layer 911 and the pad 912 located on and connected with the circuit layer 911; and the solder ball 42 is bonded on the pad 912. In particular, the solder ball 42 includes a bonding face 421 away from the wire 11, which contacts the surface of the pad 912 away from the circuit layer 911. The pad 912 has a consistent height in the first direction Z. The first direction Z is the bonding direction, and the pad 912 and the circuit layer 911 are stacked in the bonding direction.

In some implementations, the bonding face 421 and the surface of the pad 912 which contacts the bonding face 421 are both planes. The bonding face 421 and the surface of the pad 912 which contacts the bonding face 421 may also have small depressions due to the process. As such, the pad 912 will not be damaged by the solder ball 42 when the solder ball 42 is bonded on the pad 912, and the pad 912 has a consistent height in the first direction Z, thereby reducing or eliminating the cratering effect.

With the wire bonding apparatus, the wire bonding method and the semiconductor device as provided in the present disclosure, it is possible to reduce or eliminate the cratering effect by adding a pre-shaping assembly with a wire pre-pressing face on a side of the wire tube, pre-pressing on the wire pre-pressing face of the pre-shaping assembly before bonding the initial solder ball at one end of the wire and the first bonding element to obtain a solder ball such that the initial solder ball has a height in the first direction greater than the height of the solder ball in the first direction, and the surface of the solder ball facing the bonding element has an increased flatness, the contact area between the solder ball and the pad increases upon subsequent bonding on the bonding element (pad), a large force is not needed while bonding the solder ball and the pad, which in turn leads to a uniform distribution of aluminum in the pad under the solder ball.

In summary, the present disclosure has been disclosed above with reference to preferred implementations. However, the preferred implementations above are not used to limit the present disclosure. On the contrary, variations and modifications may be made by those of ordinary skills in the art without departing from the spirit and scope of the present disclosure, which has a scope only defined by the following claims.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A wire bonding apparatus, comprising:
a wire tube configured to contain a wire and comprising a wire exit;
a wire heating assembly located at a side of the wire exit; and
a pre-shaping assembly located at a side of the wire tube and comprising a wire pre-pressing face; and
wherein the pre-shaping assembly has a first state and a second state, the wire pre-pressing face of the pre-shaping assembly in the first state configured to abut the wire tube, and the pre-shaping assembly in the second state configured to disengage from the wire tube,
wherein the wire pre-pressing face is a camber surface, a circle to which the camber surface of the wire pre-pressing face belongs has a radius greater than a radius of a circle to which a camber surface of a solder ball formed by heating the wire protruding out of the wire tube belongs.

2. The wire bonding apparatus of claim 1, further comprising:
a carrier platform comprising a carrier face on which a bonding element is located;
wherein an orthogonal projection of the wire tube on the carrier face lies on the carrier face;
the pre-shaping assembly in the first state is located between the carrier face and the wire tube; and
an overlap degree between an orthogonal projection of the pre-shaping assembly in the second state on the carrier face and an orthogonal projection of the wire tube on the carrier face is 0.

3. The wire bonding apparatus of claim 2, wherein the wire tube extends in a first direction, and the wire bonding apparatus further comprises a first driver connected with the wire tube;
wherein the first driver is configured to drive the wire tube to reciprocate in the first direction.

4. The wire bonding apparatus of claim 3, further comprising a second driver connected with the pre-shaping assembly;
wherein the second driver is configured to drive the pre-shaping assembly to switch between the first state and the second state.

5. The wire bonding apparatus of claim 4, wherein the second driver is configured to drive the pre-shaping assembly to move in a second direction intersecting the first direction.

6. The wire bonding apparatus of claim 3, further comprising:
a holder comprising a guiding groove extending in the first direction;
wherein the wire tube passes through the guiding groove and is fixed in the guiding groove.

7. The wire bonding apparatus of claim 2, wherein the camber surface of the solder ball faces the carrier face.

8. The wire bonding apparatus of claim 2, further comprising a wire pulling assembly;
wherein the wire tube is located between the wire pulling assembly and the carrier platform.

9. The wire bonding apparatus of claim 8, further comprising a wire tensioning assembly;
wherein the wire pulling assembly is located between the wire tensioning assembly and the wire tube.

10. The wire bonding apparatus of claim 2, wherein the pre-shaping assembly in the first state is located on the carrier face.

11. The wire bonding apparatus of claim 1, wherein at least a part of the wire pre-pressing face is a plane.

12. A wire bonding method, comprising:
starting a wire heating assembly to convert a wire protruding from a wire exit of a wire tube into an initial solder ball;
driving a pre-shaping assembly to move relative to the wire exit such that a wire pre-pressing face of the pre-shaping assembly contacts the initial solder ball;
driving the wire tube to move in a first direction relative to the pre-shaping assembly so as to generate a pre-pressure between the initial solder ball and the wire pre-pressing face of the pre-shaping assembly to convert the initial solder ball into a solder ball, wherein a height of the initial solder ball in the first direction is greater than a height of the solder ball in the first direction;
driving the pre-shaping assembly to move away from the wire tube; and
placing a first bonding element on a bonding site, driving the wire tube to move in the first direction relative to the first bonding element, and bonding the solder ball on the first bonding element,
wherein the wire pre-pressing face is a camber surface, a circle to which the camber surface of the wire pre-pressing face belongs has a radius greater than a radius of a circle to which a camber surface of a solder ball formed by heating the wire protruding out of the wire tube belongs.

13. The wire bonding method of claim 12, wherein the first bonding element comprises a circuit layer and a pad, and the pad is located on and connected with the circuit layer; and
bonding the solder ball on the first bonding element comprises:
bonding the solder ball on the pad.

14. The wire bonding method of claim 12, further comprising: after bonding the solder ball on the first bonding element,
driving the wire tube to disengage from the solder ball;
moving the first bonding element to be away from the bonding site, and pulling wire out of the wire tube during a process of moving the first bonding element; and
placing a second bonding element on the bonding site, driving the wire tube to move towards the second bonding element, and bonding the wire on the second bonding element.

15. The wire bonding method of claim 12, further comprising: before driving the pre-shaping assembly to move away from the wire tube,
driving the wire tube to disengage from the pre-shaping assembly.

16. The wire bonding method of claim 12, wherein:
a carrier platform comprises a carrier face on which a bonding element is located;
wherein an orthogonal projection of the wire tube on the carrier face lies on the carrier face;
the pre-shaping assembly in a first state is located between the carrier face and the wire tube; and an overlap degree between an orthogonal projection of the pre-shaping assembly in a second state on the carrier face and an orthogonal projection of the wire tube on the carrier face is 0.

17. The wire bonding method of claim 16, further comprising driving the pre-shaping assembly to switch between the first state and the second state.

18. The wire bonding method of claim 12, further comprising driving the wire tube to reciprocate in the first direction.

19. The wire bonding method of claim 12, further comprising driving the pre-shaping assembly to move in a second direction intersecting the first direction.

20. The wire bonding method of claim 16, wherein the camber surface of the solder ball faces the carrier face.

* * * * *